United States Patent
Fukagawa

(10) Patent No.: US 8,323,806 B2
(45) Date of Patent: Dec. 4, 2012

(54) RARE EARTH MAGNET AND METHOD FOR PRODUCING SAME

(75) Inventor: Tomoki Fukagawa, Osaka (JP)

(73) Assignee: Hitachi Metals, Ltd., Tokyo (JP)

(*) Notice: Subject to any disclaimer, the term of this patent is extended or adjusted under 35 U.S.C. 154(b) by 405 days.

(21) Appl. No.: 12/636,341

(22) Filed: Dec. 11, 2009

(65) Prior Publication Data

US 2010/0092660 A1    Apr. 15, 2010

Related U.S. Application Data

(60) Division of application No. 12/145,595, filed on Jun. 25, 2008, now Pat. No. 7,655,325, which is a continuation of application No. PCT/JP2006/325856, filed on Dec. 26, 2006.

(30) Foreign Application Priority Data

Dec. 28, 2005 (JP) ................. 2005-378905

(51) Int. Cl.
    *B32B 15/04* (2006.01)
(52) U.S. Cl. .............. 428/693.1; 427/127; 427/132
(58) Field of Classification Search .......... 428/336, 428/457, 900, 544, 615, 655, 668, 411.1, 428/689, 692.1, 693.1; 427/127, 129, 132, 427/248.1, 250, 255.36, 383.1, 383.7; 148/101, 148/302, 537, 527
See application file for complete search history.

(56) References Cited

U.S. PATENT DOCUMENTS

| 5,154,978 A | * | 10/1992 | Nakayama et al. | 428/469 |
| 6,254,694 B1 | * | 7/2001 | Hasegawa et al. | 148/101 |
| 6,275,130 B1 | | 8/2001 | Yoshimura et al. | |

FOREIGN PATENT DOCUMENTS

| JP | 62-192566 A | | 8/1987 |
| JP | 2002-75716 A | | 3/2002 |
| JP | 2004304038 A | * | 10/2004 |

OTHER PUBLICATIONS

Fukagawa; "Rare Earth Magnet and Method for Producing Same", U.S. Appl. No. 12/145,595, filed Jun. 25, 2008.
Official Communication issued in corresponding Japanese Patent Application No. 2007-552929, mailed on Sep. 20, 2011.

* cited by examiner

*Primary Examiner* — Stanley Silverman
*Assistant Examiner* — Kallambella Vijayakumar
(74) *Attorney, Agent, or Firm* — Keating & Bennett, LLP

(57) ABSTRACT

A rare-earth magnet includes a magnet body made of an R—Fe—B based rare-earth magnet material (where R is at least one rare-earth element) and a metal film that has been deposited on the surface of the magnet body. The magnet further includes a plurality of reaction layers between the magnet body and the metal film. The reaction layers include: a first reaction layer, which contacts with at least some of $R_2Fe_{14}B$ type crystals, included in the magnet body, to have received the rare-earth element that has been included in the $R_2Fe_{14}B$ type crystals; and a second reaction layer, which is located between the first reaction layer and the metal film and which has a lower rare-earth element concentration than that of the first reaction layer.

7 Claims, 7 Drawing Sheets

RARE EARTH MAGNET AND METHOD FOR PRODUCING SAME

This application is a Divisional of S1. Ser. No. 12/145,595 filed Jun. 25, 2008, now U.S. Pat. No. 7,655,325, which is a continuation of PCT/JP2006/325856 filed Dec. 26, 2006, and claims priority over Japanese Application 2005-378905 filed Dec. 28, 2005.

BACKGROUND OF THE INVENTION

1. Field of the Invention

The present invention relates to a rare-earth magnet and a method for producing the magnet.

2. Description of the Related Art

An R—Fe—B based rare-earth sintered magnet is known as a magnet with the highest performance among various types of permanent magnets, and has been used extensively in a voice coil motor (VCM) for a hard disk drive and in a magnetic circuit for a magnetic resistance imaging (MRI), for example.

In the prior art, an R—Fe—B based sintered magnet embedded in a magnetic circuit has a weight of about 100 g to about 1 kg each. Depending on the applications, some big magnets may have a weight exceeding 1 kg. Recently, however, small-sized sintered magnets have been used more and more often in optical pickups and motors of very small sizes, for example. Some of those small-sized sintered magnets may have a weight of less than 1 g.

A magnetic circuit that adopts such small-sized and lightweight magnets needs to keep the performance of a final product high enough while meeting the demands for reducing the size and weight of the final product. That is why magnets for use in such a magnetic circuit should exhibit strong magnetic properties even though their size is small. Therefore, there have been growing demands for high-performance R—Fe—B based sintered magnets in the field of small-sized magnets, too.

It is known that the coercivity of an Nd—Fe—B based magnet is produced by its internal nanostructure in which an $Nd_2Fe_{14}B$ main phase is surrounded with thin Nd-rich phases, thus realizing a high maximum energy product.

However, when an Nd—Fe—B based sintered magnet is actually used in motors, for example, the magnet is usually subjected to a grinding process to finish it in a desired final size and to obtain a predetermined degree of concentricity. During that process, the Nd-rich phase on the surface layer of the magnet is often damaged due to very small grinding cracks or oxidation. As a result, the magnetic properties on the surface portion of the magnet may decrease to only a fraction of the properties inside the magnet.

This phenomenon is observed particularly noticeably in small-sized magnets with a large surface area to volume ratio. For example, if a block magnet of 10 mm square, having a $(BH)_{max}$ of 360 kJ/m$^3$, is cut into rectangular parallelepiped shapes with dimensions of 1 mm×1 mm×2 mm and then subjected to a grinding process, then their $(BH)_{max}$ will decrease to about 240 kJ/m$^3$. As a result, the essential properties of the Nd—Fe—B based rare-earth magnet are not realized anymore.

Also, as a result of the machining process, a machine-degraded layer having no coercivity anymore is always formed on the surface of the sintered magnet. Since the coercivity of the magnet has been lost from such a machine-degraded layer, that layer will not function as a magnet even when magnetized. If the sintered magnet has a sufficiently large volume, such a machine-degraded layer, if ever, accounts for just a small volume percentage. Thus, the overall performance of the magnet is hardly affected by the machine-degraded layer. However, if the sintered magnet has a decreased volume, then the machine-degraded layer accounts for an increased volume percentage. In that case, its influence is non-negligible.

Suppose the volume of the machined sintered magnet is V, the total surface area of the sintered magnet is S, and the thickness of the machine-degraded layer is d. In that case, the volume of the machine-degraded layer is approximated at Sd. Therefore, the volume percentage of the machine-degraded layer to the overall sintered magnet with the volume V is Sd/V. The volume of the intact portion of the sintered magnet, still maintaining coercivity, is given by V-Sd. Thus, the remanence of the overall machined magnet is obtained by multiplying its original value (i.e., before the machining process) by (V−Sd)/V=1−Sd/V. That is to say, the Sd/V value of a magnet becomes an index indicating how much the machine-degraded layer of the magnet affects its magnetic properties.

Sd/V is the product of S/V and d. The former is a factor determined only by the shape of the magnet, whereas the latter is a factor determined by the process history of the machine-degraded layer. The smaller the volume of a magnet, the larger S/V becomes and the smaller d should be.

Hereinafter, conventional techniques of doing some type of processing on the surface of a sintered magnet will be described.

Patent Document No. 1 discloses a permanent magnet material, in which a rare-earth metal such as Nd, Pr, Dy, Ho, Tb, La, Ce, Sm, Gd, Er, Eu, Tm, Yb, Lu or Y has been deposited on the surface to be machined and turned into a reformed layer through a diffusion process.

Patent Documents Nos. 2 and 3 teach forming a film of titanium metal or a titanium compound such as titanium, a titanium nitride, a titanium carbide or a titanium oxide on the surface of a rare-earth-iron based magnet.

Patent Document No. 4 proposes providing a coating of a compound including Ti and at least one element selected from the group consisting of Nd, Fe, B and O.

Patent Document No. 5 teaches forming a thin-film layer, consisting essentially of Sm and Co, on the ground surface of an Nd—Fe—B based sintered magnet that has been subjected to a grinding process.

Patent Document No. 6 teaches coating the surface of a machined magnet with a refractory metal (which may be Ta with a particle size of 100 µm or less according to a working example) and also proposes embedding the magnet in particles of the refractory metal and dissolving them at a temperature of 700° C. to 900° C.

Patent Document No. 7 discloses a method of improving the loop squareness by depositing Pd or a Pd metal layer on the surface of a machined magnet by an evaporation process, for example, and then melting the machine-degraded layer with a laser beam. Pd is used to get the plating process done more easily.

Patent Document No. 8 discloses a rare-earth magnet that has been machined so as to have an S/V value of 2 mm$^{-1}$ or more and a volume of 100 mm$^3$ or less. According to Patent Document No. 8, to reform a degraded and damaged portion formed by a machining process, a rare-earth metal is diffused from the surface of the magnet so as to penetrate deeper than the radius of crystal grains that are exposed on the surface of the magnet.

Patent Document No. 1: Japanese Patent Application Laid-Open Publication No. 62-74048

Patent Document No. 2: Japanese Patent Application Laid-Open Publication No. 63-9908

Patent Document No. 3: Japanese Patent Application Laid-Open Publication No. 63-9919

Patent Document No. 4: Japanese Patent Application Laid-Open Publication No. 63-168009

Patent Document No. 5: Japanese Patent Application Laid-Open Publication No. 2001-93715

Patent Document No. 6: Japanese Patent Application Laid-Open Publication No. 2001-196209

Patent Document No. 7: Japanese Patent Application Laid-Open Publication No. 2002-212602

Patent Document No. 8: Japanese Patent Application Laid-Open Publication No. 2004-304038

Recently, there are growing demands for ultra small magnets. The demands are escalating not just in the fields of optical pickups and ultra small motors but also in the fields of cardiosurgery and neurosurgery as well. In the fields of these cutting-edge medical treatments, a technique for controlling the direction in which a vascular catheter advances at a branching point of a blood vessel by attaching a small high-performance magnet to the end of the catheter and applying a magnetic field from outside of the patient's body has been researched. On the other hand, in a magnetic induction surgical system, it has been proposed that an ultra small magnet be embedded at a particular location of the body and used as a location marker. The ultra small magnets for use in such applications should have a cylindrical shape with a diameter of 0.3 mm and a length of 2 mm, for example. In that case, the S/V value exceeds 10 $mm^{-1}$. Such a magnet needs to have magnetic properties that are high enough to make the magnet work fine irrespective of its small size.

If the size of a magnet is reduced, however, the performance of the magnet, which would be much higher if the magnet had a big size, may not be exhibited fully.

Patent Document No. 1 proposes coating the machine-degraded layer on the ground surface of a sintered magnet with a thin rare-earth metal layer to make a reformed layer through a diffusion reaction. More specifically, Patent Document No. 1 discloses an experimental example in which a sputtered film is formed on a thin test piece with a length of 20 mm, a width of 5 mm and a thickness of 0.15 mm but achieves a $(BH)_{max}$ of only 200 $kJ/m^3$ at most. Also, the surface is oxidized during the diffusion process by annealing, thus causing inconvenience in the subsequent surface treatment.

Patent Documents Nos. 2, 3 and 4 disclose techniques for increasing the corrosion resistance of a rare-earth-iron based magnet to be corroded easily but are silent about how to repair the degradation caused by machining.

According to the technique disclosed in Patent Document No. 5, Sm, diffusing into the magnet as a result of the heat treatment process, deteriorates the magnetic anisotropy of the $Nd_2Fe_{14}B$ phase crystals.

According to the technique disclosed in Patent Document No. 6, as long as heat treatment is carried out, it is difficult to minimize the oxidation at the surface of a rare-earth magnet. Consequently, it is also difficult to recover the properties just as intended.

In the method disclosed in Patent Document No. 7, it is not cost effective to deposit Pd metal or melt the machine-degraded layer with a laser beam.

Patent Document No. 8 reports that by depositing a heavy rare-earth element Dy or Tb by a sputtering process and diffusing the element into the mother phase, not only can the magnetic properties be recovered but also can the coercivity be increased significantly. However, the heat treatment process adopted in this method is not cost effective because it is necessary to control the concentration of oxygen in the atmosphere and the dew point thereof with high precision. Besides, this method lacks mass-productivity because a lot of magnets cannot be processed in a single batch.

SUMMARY OF THE INVENTION

In order to overcome the problems described above, the present invention provides a rare-earth magnet with minimal deterioration in properties at the surface and a method for producing such a magnet.

A rare-earth magnet according to a preferred embodiment of the present invention includes a magnet body made of an R—Fe—B based rare-earth magnet material (where R is at least one rare-earth element) and a metal film that has been deposited on the surface of the magnet body. The magnet further includes a plurality of reaction layers between the magnet body and the metal film. The reaction layers include: a first reaction layer, which contacts with at least some of $R_2Fe_{14}B$ type crystals, included in the magnet body, to have received the rare-earth element that has been included in the $R_2Fe_{14}B$ type crystals; and a second reaction layer, which is located between the first reaction layer and the metal film and which has a lower rare-earth element concentration than that of the first reaction layer.

In one preferred embodiment, the second reaction layer has boron that has been included in the $R_2Fe_{14}B$ type crystals and has a higher boron concentration than that of the first reaction layer.

In another preferred embodiment, the rare-earth element concentration of the first reaction layer accounts for at least 30 mass % of the entire composition of the first reaction layer.

In still another preferred embodiment, the first reaction layer has a thickness of at least 10 nm.

In yet another preferred embodiment, the magnet body has a surface area to volume ratio of at least 2 $mm^{-1}$ and a volume of at most 100 $mm^3$.

In yet another preferred embodiment, the surface of the magnet body includes a surface area that has been formed by a machining process and that is covered with the metal film.

In yet another preferred embodiment, the metal film is made of at least one metal that is selected from the group consisting of Ti, V, Zr, Nb, Mo, Hf, Ta and W or an alloy thereof.

In yet another preferred embodiment, the surface area of the magnet body has a surface roughness Ra of 0.5 μm or less.

In yet another preferred embodiment, the rare-earth magnet further includes an anti-corrosive coating that has been formed so as to cover the metal film.

A method for producing a rare-earth magnet according to another preferred embodiment of the present invention includes the steps of: providing a magnet body made of an R—Fe—B based rare-earth magnet material (where R is at least one rare-earth element); and depositing a metal film on the surface of the magnet body. The method further includes a heat treatment process step that is performed to form, between the magnet body and the metal film, a plurality of reaction layers including: a first reaction layer, which contacts with at least some of $R_2Fe_{14}B$ type crystals, included in the magnet body, to have received the rare-earth element that has been included in the $R_2Fe_{14}B$ type crystals; and a second reaction layer, which is located between the first reaction layer and the metal film and which has a lower rare-earth element concentration than that of the first reaction layer.

In one preferred embodiment, the second reaction layer has received boron that has been included in the $R_2Fe_{14}B$ type crystals and has a higher boron concentration than that of the first reaction layer.

In another preferred embodiment, the rare-earth element concentration of the first reaction layer accounts for at least 30 mass % of the entire composition of the first reaction layer.

In still another preferred embodiment, the first reaction layer has a thickness of at least 10 nm.

In yet another preferred embodiment, the magnet body has a surface area to volume ratio of at least 2 mm$^{-1}$ and a volume of at most 100 mm$^3$.

In yet another preferred embodiment, the surface of the magnet body includes a surface area that has been formed by a machining process and that is covered with the metal film.

In yet another preferred embodiment, the metal film is made of at least one metal that is selected from the group consisting of Ti, V, Zr, Nb, Mo, Hf, Ta and W or an alloy thereof.

In yet another preferred embodiment, the surface area of the magnet body has a surface roughness Ra of 0.5 μm or less.

Various preferred embodiments of the present invention provide a rare-earth permanent magnet, of which the degradation in magnetic properties at the surface can be minimized and which can exhibit excellent corrosion resistance even under a harsh environment.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
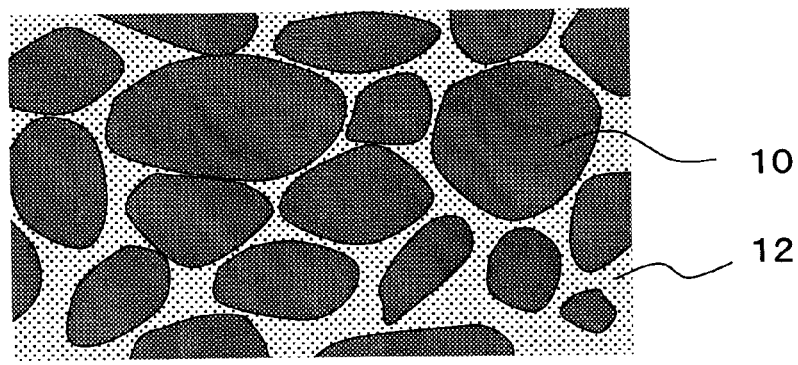
FIG. 1A is a cross-sectional view schematically illustrating the nanostructure of a rare-earth sintered magnet.
FIG. 1B is a cross-sectional view of the sintered magnet of which the surface has been subjected to a machining process.
FIG. 1C is a cross-sectional view of a sintered magnet in which a metal film and reaction layers have been formed on its surface.
Figure 1:
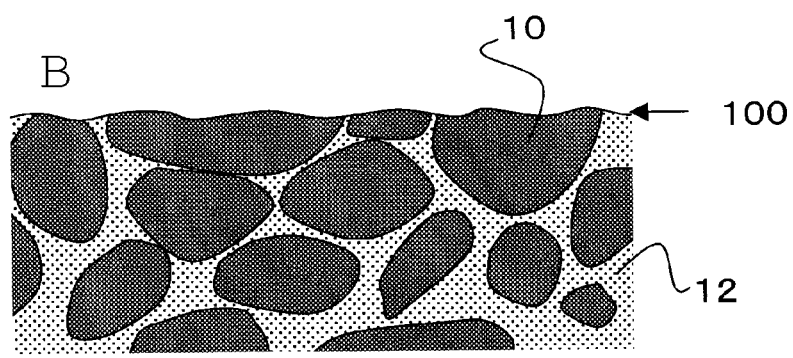
Figure 1:
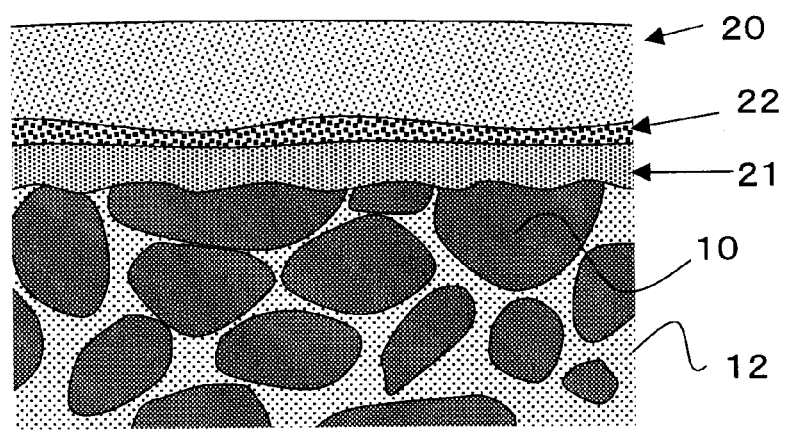

The present inventors discovered that if the surface of a very small magnet, which had been produced by subjecting a block of a rare-earth sintered magnet to cutting, boring, grinding, polishing or any other machining process, was reformed, then the degradation in magnetic properties at the surface could be repaired and the corrosion resistance could also be improved, thus perfecting the present invention.

According to a preferred embodiment of the present invention, a film of a particular metal is deposited on the surface of a magnet body and then subjected to a heat treatment process, thereby forming a reaction layer with a two-layer structure. Thanks to the function of this reaction layer, the magnetic properties at the surface of the magnet body can be improved.

A magnet body for use in preferred embodiments of the present invention may have any composition as long as the magnet can be turned into a desired shape by processing a bulk magnet material. Its manufacturing process is not limited to any particular one, either. However, the present invention is applicable most effectively to magnets that have a coercivity producing mechanism of a nucleation type. Typical examples of the magnets of this type include R—Fe—B based sintered magnets and 1-5 Sm—Co sintered magnets. Among other things, the R—Fe—B based sintered magnets have excellent machinability and can be processed into a shape of a very small size relatively easily. In R—Fe—B based sintered magnet, R is at least one rare-earth element and preferably includes at least one of Nd and Pr as an essential element and may include Dy and/or Tb if necessary. As a specific composition, a magnet composition that is currently used extensively as an Nd—Fe—B based magnet may be adopted. In the magnets of such a material, the balance between the flux density and the coercivity can be adjusted by changing the percentages of Nd replaced with Dy or Tb in the rare-earth element R.

An R—Fe—B based sintered magnet, having a known composition such as that disclosed in Japanese Patent Gazette for Opposition No. 59-64733, for example, is preferably used as the magnet body according to a preferred embodiment of the present invention. The R—Fe—B based sintered magnet has a composition consisting essentially of a rare-earth element R, boron B and Fe. More specifically, the magnet includes 8 at % to 30 at % of R, 2 at % to 28 at % of B, and the balance consisting essentially of Fe. A portion (at most 50%) of Fe may be replaced with Co. Also, a portion of B may be replaced with carbon C. In the rare-earth elements R, the sum of Dy and Tb preferably accounts for at least 0.3 at % of all rare-earth elements R and the balance is preferably Nd and/or Pr. A more preferable composition includes 13 at % to 15 at % of R and 5.5 at % to 7 at % of B.

The sintered magnet body described above may be produced by performing various powder metallurgical manufacturing process steps including melting a material alloy, pulverizing the alloy, compacting the powder under a magnetic field, sintering the green compact, and subjecting the sintered compact to an aging treatment.

According to a preferred embodiment of the present invention, the surface of the magnet body is preferably planarized as much as possible before the metal film is deposited thereon. Typical examples of the machining processes that can be adopted in preferred embodiments of the present invention include wire sawing, blade sawing, surface grinding and lapping. However, the present invention is in no way limited to these specific examples but any other machining process may be adopted as well. It should be noted that a rare-earth sintered magnet material is so brittle as to cause grain detachment easily during the machining process. If too many grains were detached from the magnet material, no uniform reaction layers could be formed and the magnetic properties would not be recovered even when the metal film is deposited on the machined surface. That is why before the metal film is deposited, the machined surface has preferably been finished so as to avoid grain detachment. Also, the machined surface preferably has as little oxide as possible.

Hereinafter, it will be described with reference to FIGS. 1A through 1C why the magnet performance is improved by the structure of the present invention.

FIG. 1A is a partial cross-sectional view schematically illustrating the internal nanostructure of an R—Fe—B based rare-earth sintered magnet. FIG. 1B is a partial cross-sectional view of the sintered magnet of which the surface has been subjected to a machining process. And FIG. 1C is a partial cross-sectional view of a magnet according to a preferred embodiment of the present invention in which a metal film and reaction layers have been formed on its surface.

As shown in FIG. 1A, inside the R—Fe—B based rare-earth sintered magnet, $R_2Fe_{14}B$ type crystal grains 10 as a main phase are surrounded with a grain boundary phase (auxiliary phase) 12, and those crystal grains 10 are separated from each other by the grain boundary phase 12. It is known that in an $R_2Fe_{14}B$ based rare-earth sintered magnet, the grain boundary phase 12 plays an important role in producing the coercivity as described above. The grain boundary phase 12 includes an R-rich phase (not shown) that has a higher rare-earth element concentration than that of the main phase 10.

If the rare-earth sintered magnet is subjected to a machining process to expose the surface 100 of the magnet body, then some main phases (i.e., $R_2Fe_{14}B$ type crystals) that are not covered with the grain boundary phase 12 are present on the surface 100 of the magnet body (i.e., on the machined surface). The grain boundary phase 12 plays a very important role in producing the coercivity as described above. However, as the surface 100 of the magnet body is not covered with the grain boundary phase 12 as shown in FIG. 1B, the magnetic properties will deteriorate at and near the surface 100 of the magnet body.

On the other hand, according to a preferred embodiment of the present invention, the magnetic properties could be improved by not just covering the surface of the magnet body 100 with a metal film 20 but also forming special reaction layers 21 and 22 as shown in FIG. 1C. These reaction layers 21 and 22 are believed to perform a similar function to that of the internal grain boundary phase 12.

The properties and thicknesses of the reaction layers 21 and 22 change according to the type of the metal film 20 deposited and the heat treatment temperature. The present inventors discovered and confirmed via experiments that when a metal film 20 made of at least one metal selected from the group consisting of Ti, V, Zr, Nb, Mo, Hf, Ta and W or an alloy thereof was deposited and when the heat treatment was conducted at a temperature of 400° C. to 750° C., most preferred reaction layers 21 and 22 could be obtained.

The metallic material such as Ti cited above tends to be easily bonded to iron or boron in a rare-earth sintered magnet by nature. Thus, the present inventors discovered that if a film of the metal was deposited on the surface 100 of the magnet body and then thermally treated under proper conditions, the metal film 20 reacted with the surface 100 of the magnet body to form at least two reaction layers 21 and 22 having mutually different compositions in the thickness direction.

The first reaction layer 21 contacts with at least a portion of the main phase (i.e., $R_2Fe_{14}B$ type crystals) 10 included in the magnet body and has received the rare-earth element that has been included in the $R_2Fe_{14}B$ type crystals. The rare-earth element concentration of the first reaction layer 21 preferably accounts for at least 30 mass %, and more preferably 35 mass % or more, of the entire composition of the first reaction layer 21. When the rare-earth element has such a high concentration in the first reaction layer 21, the first reaction layer 21 will function in the same way as the R-rich phase that is located on the grain boundary between the main phases ($R_2Fe_{14}B$ type crystals) 10 of the rare-earth sintered magnet. However, the present inventors also discovered that when the rare-earth element concentration was too low, the first reaction layer 21 functioned as a ferromagnetic layer to deteriorate the magnetic properties rather than improving them.

As described above, the grain boundary phase 12 plays a key role in producing coercivity in a rare-earth sintered magnet. However, if the surface of the main phase ($R_2Fe_{14}B$ type crystals) 10 that would otherwise be exposed is covered with the first reaction layer 21 on the surface 100 of the magnet body, then the first reaction layer 21 functions in the same way as the grain boundary phase 12, thus minimizing the decrease in coercivity at and near the surface 100 of the magnet body.

To achieve such an effect of maintaining the coercivity, the first reaction layer 21 is preferably as thick as the grain boundary phase 12 of the rare-earth sintered magnet and preferably has a thickness of 10 nm to 200 nm, for example. It should be noted that it is important to deposit the first reaction layer 21 as a continuous film that never discontinues at the interface.

On the other hand, the second reaction layer 22 is located between the first reaction layer 21 and the metal film 20 and has a lower rare-earth element concentration than that of the first reaction layer 21. The second reaction layer 22 includes boron that has been included in the main phase (i.e., the $R_2Fe_{14}B$ type crystals) 10 and has a higher boron concentration than that of the first reaction layer 21. The second reaction layer 22 is formed as a result of an increase in boron concentration while the metal film 20 described above is reacting with the surface 100 of the magnet body because constituent atoms of the metal film 20 are easily bonded to boron included in the magnet body by nature. By forming the second reaction layer 22 by taking advantage of such a property of the metal, the first reaction layer 21 with a higher rare-earth element concentration (than the main phase 10) can be provided between the second reaction layer 22 and the main phase 10. That is to say, if a heat treatment process is carried out at an appropriate temperature after a film of a metallic material that easily reacts with boron has been deposited, a layer with an increased boron concentration (i.e., the second reaction layer 22) and a layer with an increased rare-earth element concentration (i.e., the first reaction layer 21) can be formed substantially simultaneously.

If the metal film 20 deposited were too thick, then the flux density would decrease. For that reason, the thickness of the metal film 20 is preferably defined within such a range in which the decrease in flux density can be no greater than approximately 1%. The upper limit of the thickness of the metal film 20 may be 10 µm, for example. Nevertheless, if the metal film 20 were too thin, the reaction layers described above could not be formed. That is why the metal film 20 preferably has a thickness of at least 0.5 µm. More preferably, the metal film 20 has a thickness of 1 µm to 3 µm.

Before the metal film 20 is deposited, the machined surface 100 of the magnet body may be subjected to a known purifying process such as cleaning, degreasing or inverse sputtering. It should be noted that the metal film 20 to be deposited does not have to have a single layer structure but may also have a multilayer structure consisting of metal layers of multiple different types. In the latter case, the layers that play the most important role are the lowermost layer that contacts with the machined surface of the magnet body and the uppermost layer that is exposed to the air. The material of the lowermost layer is selected in order to recover the magnetic properties, while that of the uppermost layer may be selected from the standpoint of corrosion resistance. Among various metallic materials, Ti is highly recommended because Ti not just contributes to recovering the magnetic properties but also improves the corrosion resistance and does no harm to human bodies. When a very small magnet is used for medical purposes, Ti can be a very good coating material.

Hereinafter, preferred embodiments of the present invention will be described.

First, an Nd—Fe—B based rare-earth sintered magnet is produced by a known manufacturing process. This rare-earth sintered magnet can be made by sintering a green compact of a rare-earth magnet powder. By machining the rare-earth sintered magnet thus obtained, a magnet body can be made in desired shape and size.

The magnets to which preferred embodiments of the present invention are applied are often used in small-sized actuators and motors, and therefore, frequently are required to have a high flux density to realize high torque. For that reason, in those applications, the rare-earth element R may include either no Dy at all or a very small amount of Dy if ever. On the other hand, if Dy and/or Tb are/is contained, the coercivity can be increased significantly by depositing the metal film. Thus, to increase the coercivity, the magnets preferably include less than 2 mass % of Dy and/or Tb in the overall composition.

Subsequently, a small magnet body with an S/V ratio (which is the ratio of the surface area S ($mm^2$) to the volume V ($mm^3$)) of 2 $mm^{-1}$ or more is cut out of the magnet body. Next, the surface of the magnet body is processed by a barrel polishing process or any other suitable process, thereby smoothing the surface to a surface roughness Ra of 0.5 µm.

Thereafter, a metal film is deposited on the surface of the magnet body. A wet deposition process such as plating produces hydrogen that would deteriorate the performance of the magnet, and therefore, a dry deposition process is preferred. Dry deposition processes are classifiable into physical vapor deposition (PVD) processes and chemical vapor deposition (CVD) processes. The PVD processes include vaporizing types and sputtering types. Examples of the former types include evaporation, ion plating, arc ion plating, hollow cathode ion plating, and ion beam evaporation. As a sputtering type, a magnetron sputtering is generally adopted. Examples of the CVD processes include thermal CVD, plasma CVD, optical CVD and MOCVD. Any of these methods may be adopted. Considering the deposition rate and the maintainability of the system, however, ion plating or magnetron sputtering is preferably adopted. Optionally, to increase the degree of close contact between the metal film and the magnet body, the magnet body may be heated to a temperature of 200° C. to 400° C. when the metal film is deposited.

In a preferred embodiment of the present invention, after a metal film has been deposited on the surface of the magnet body, a heat treatment is carried out at a temperature of 400° C. to 1,000° C., preferably at a temperature of 500° C. to 750° C. To advance the interfacial reaction, the magnet needs to be heated to 400° C. or more. The heat treatment process time changes with the heat treatment temperature. For example, if the heat treatment temperature is 400° C., the heat treatment process time may be three to five hours. As the heat treatment temperature rises, the heat treatment process time can be shortened. However, if the heat treatment temperature exceeded 1,000° C., the magnet structure could change and it would become difficult to control the formation of the reaction layers. Optionally, part or all of the reaction layers may be formed while the metal film is being deposited. In any case, the magnet needs to be heated to a temperature of 400° C. or more that is higher than the maximum allowable temperature for a normal thin-film deposition system, the heater in the thin-film deposition system should have an increased size.

After the metal film has been deposited and after the reaction layers have been formed, an anticorrosive coating may be further formed on the metal film. Although the corrosion resistance has already been increased by the metal film, the magnet should have particularly high surface purity especially when used in a voice coil motor (VCM) for a hard disk drive. That is why a Ni film is preferably formed on the uppermost surface by electrical plating process. On the other hand, if adhesiveness is required, the uppermost surface is preferably coated with Al.

As described above, the present invention has an effect of minimizing the degradation in magnetic properties at the surface and can achieve a significant effect in a small magnet that has a large surface area S for its volume V. A magnet body on which the effect of the present invention can be achieved most significantly is an ultra small magnet with an S/V ratio of 2 $mm^{-1}$ or more and a volume V of 100 $mm^3$ or less. For example, a cubic magnet with a size of 2 mm each side has a surface area of 24 $mm^2$ and a volume of 8 $mm^3$. Thus, its surface area to volume ratio is 3 $mm^{-1}$. Compared to a cubic magnet with the same volume, a cylindrical magnet has a greater surface area to volume ratio. In such an ultra small magnet, if the magnetic properties deteriorated at the surface, its influence on the overall magnet performance would be a non-negligible one. Therefore, if a machine-degraded layer were formed on the surface of an ultra small magnet, then the loop squareness of the demagnetization curve and the coercivity would decrease significantly. Cylindrical magnets currently used in vibrating motors for cellphones on the market have an outside diameter of about 2.5 mm, an inside diameter of about 1 mm, and a length of about 4 mm. And their volume is approximately 16.5 mm$^3$. Thus, those magnets have a surface area to volume ratio of at least 2 mm$^{-1}$.

If the volume of magnets keeps on decreasing in this manner, the surface area to volume ratio will soon exceed 2 mm$^{-1}$ and may possibly go beyond 3 mm$^{-1}$ in the near future. The surface reformation of the present invention is very effectively applicable to those ultra small magnets.

The Nd—Fe—B based magnets currently used in vibrating motors for cellphones on the market have a (BH)$_{max}$ of approximately 240 kJ/m$^3$, while the magnet according to a preferred embodiment of the present invention realizes a (BH)$_{max}$ of 280 kJ/m$^3$ or more, e.g., as high as 300 to 360 kJ/m$^3$.

Hereinafter, specific examples of preferred embodiments of the present invention and comparative examples will be described.

EXAMPLE 1

A block of a sintered magnet represented by the compositional formula Nd$_{29.3}$—Dy$_{2.0}$—Fe$_{67.7}$—B$_{1.0}$ (where subscripts indicate mass percentages) was made and then machined, thereby making rectangular parallelepiped rare-earth magnet materials with dimensions of 6 mm×4 mm×2 mm (which will be referred to herein as "magnet test pieces"). The magnetization direction of these magnet test pieces was parallel to the side with a length of 6 mm.

The magnet test pieces were loaded into the chamber of a hollow cathode ion plating system to deposit a Ti film to a thickness of 2 μm on the surface of the magnet test pieces. Specifically, the Ti film was deposited under the conditions including a deposition process time of 25 minutes, a bias voltage of 25 V or more, and a carrier gas flow rate of 200 cc/min.

Next, the test pieces were thermally treated at a temperature of 500° C. to 900° C. for one hour, thereby forming reaction layers between the metal film and the magnet body. For the purpose of comparison, the test pieces were also thermally treated at 200° C. and 300° C. for an hour.

Figure 2:
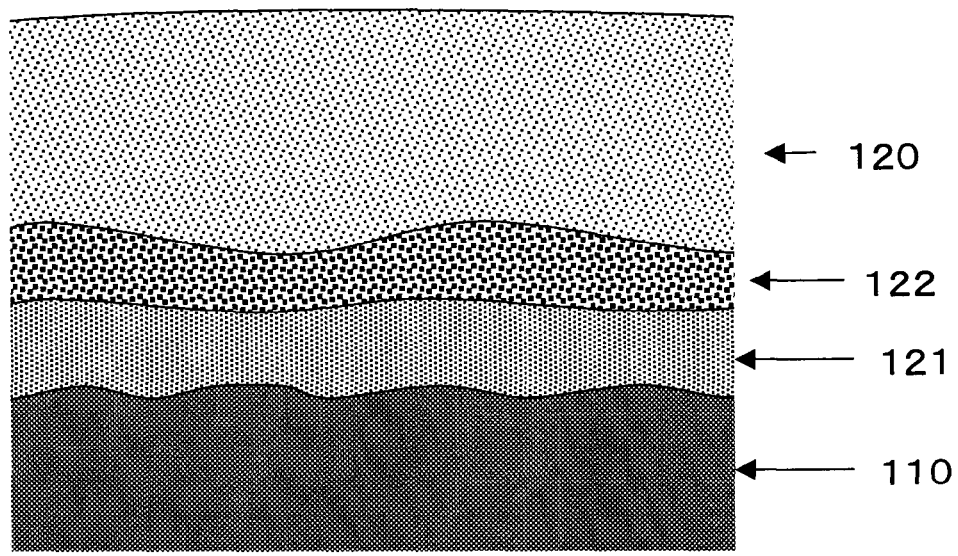
FIG. 2 is a cross-sectional view that was drawn based on a TEM photograph of a specific example of preferred embodiments of the present invention.

FIG. 2 is a cross-sectional view that was drawn based on a TEM photograph of a sample representing a specific example of the present invention. As can be seen from FIG. 2, in this specific example, an Nd-rich layer (first reaction layer) 121 and a Ti—Fe—B layer (second reaction layer) 122 were formed between a main phase (Nd$_2$Fe$_{14}$B crystal grains) 110 and a Ti film 120. The Nd concentration of the first reaction layer 121 was higher than that of the main phase 110 and the concentration of Nd increased there. On the other hand, in the second reaction layer 122, Ti, Fe and B (boron) were present at higher concentrations than in the first reaction layer 121. Fe and boron included in the second reaction layer 122 came from the main phase (Nd$_2$Fe$_{14}$B crystal grains) 110 of the magnet body. And the boron concentration of the second reaction layer 122 was higher than that of the first reaction layer 121. Boron would have bonded to Fe and Ti to form a boride. These reaction layers 121 and 122 with such a two-layer structure would have been formed by depositing a metal film 120, which reacted easily with boron, on the surface of the magnet body and thermally treating it at a temperature of 400° C. or more.

As a comparative example, another sample was made by depositing an Al film to a thickness of 2 μm on the surface of the magnet body instead of the Ti film 120 and then thermally treating it at 500° C. for an hour. The magnetic properties of this sample representing a comparative example were evaluated. As a result, the coercivity did not change but the loop squareness of the demagnetization curve decreased. When the interface was observed on a TEM photograph, it was discovered that an Nd depletion layer had been formed in contact with the main phase (Nd$_2$Fe$_{14}$B crystal grains) and a layer with an increased Nd concentration had been formed in contact with the Al film. The loop squareness would have been decreased due to the formation of the Nd depletion layer.

Figure 3:
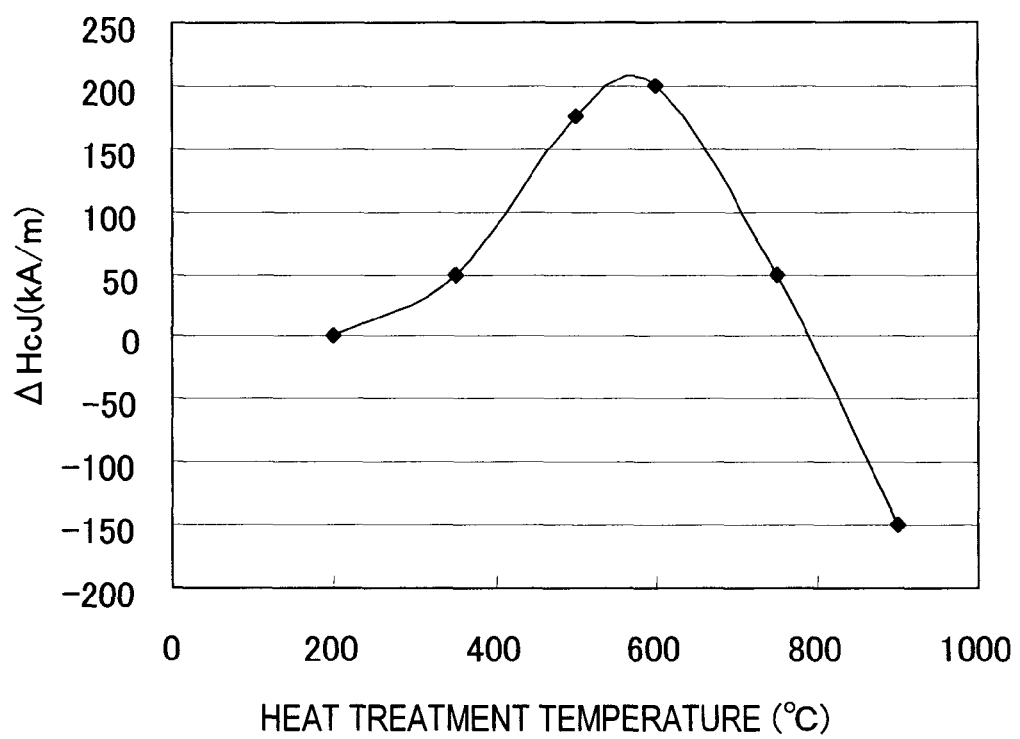
FIG. 3 is a graph showing how much the coercivity increased or decreased with the heat treatment temperature.

FIG. 3 is a graph showing, based on the data that was collected about a sample in which Ti was deposited to a thickness of 2 μm on the surface of the magnet test piece described above, how much the coercivity increased or decreased (ΔH$_{cJ}$) with the heat treatment temperature. The heat treatment was conducted for 10 minutes. In this case, the coercivity of a comparative example that was thermally treated at 200° C. was used as a reference. As can be seen from FIG. 3, the coercivity increased significantly in a heat treatment temperature range of 400° C. to 750° C.

Figure 4:
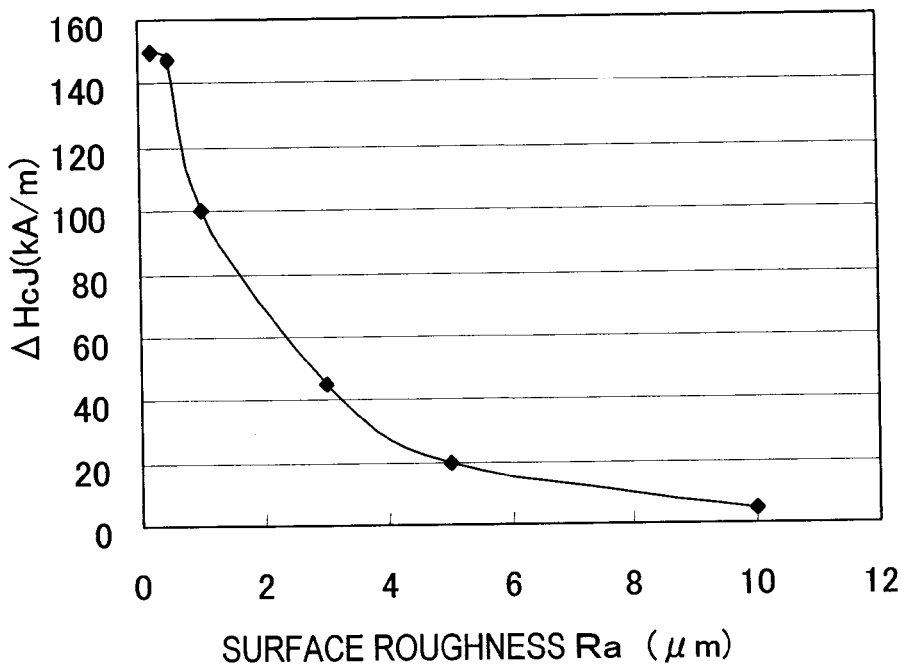
FIG. 4 is a graph showing how much the coercivity increased or decreased with the surface roughness Ra of a magnet body on which no Ti film had been deposited yet.

FIG. 4 is a graph showing how much the coercivity of a sample, on which a Ti film had been deposited to a thickness of 2 μm and which had been thermally treated at 500° C. for 10 minutes, increased or decreased (ΔH$_{cJ}$) with the surface roughness Ra of the magnet body on which the Ti film had not been deposited yet. The reference value of coercivity was 1,175 kA/m. As can be seen from FIG. 4, the smaller the surface roughness Ra, the greater the coercivity. The surface roughness Ra is preferably 0.5 μm or less, more preferably 0.1 μm or less.

EXAMPLE 2

Blocks of sintered magnets represented by the compositional formula Nd$_{30.1}$—Dy$_{1.2}$—Fe$_{67.7}$—B$_{1.0}$ (where subscripts indicate mass percentages) were made and then machined, thereby making thin-plate magnet test pieces with dimensions of 4 mm×6 mm×0.3 mm. The magnetization direction of these magnet test pieces was parallel to the side with a length of 4 mm.

The magnet test pieces were loaded into the chamber of a hollow cathode ion plating system to deposit a Ti film to a thickness of 2 μm on the surface of the magnet test pieces as in the first example described above.

Figure 5:
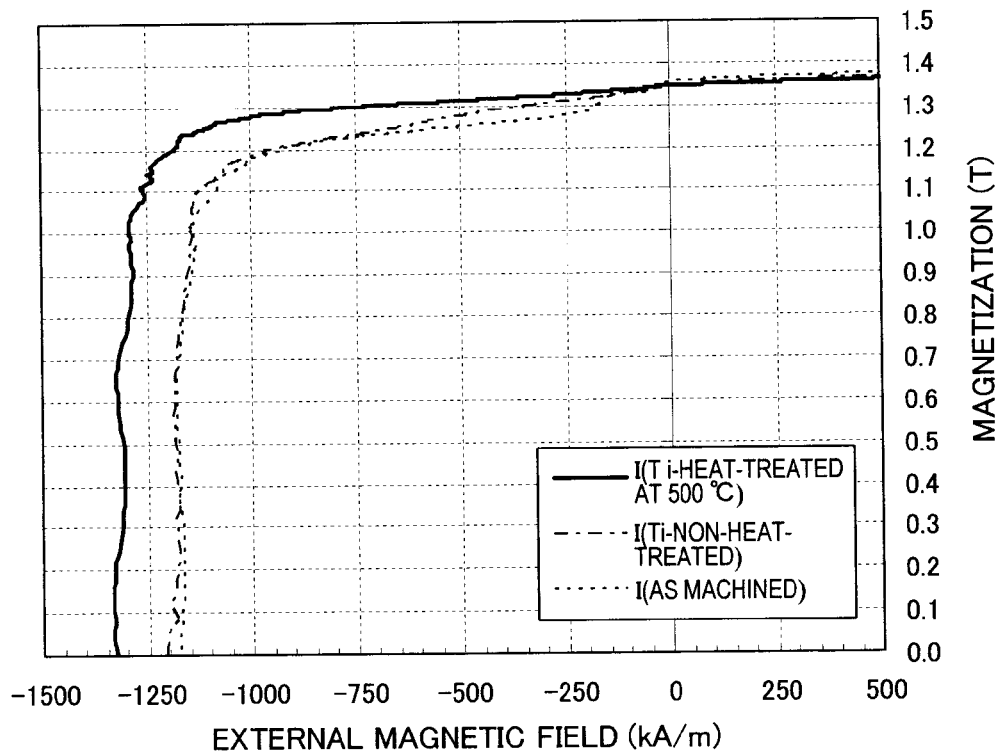
FIG. 5 is a graph showing the respective demagnetization curves of a magnet test piece on which a Ti film was deposited and which was thermally treated, a magnet test piece on which a Ti film was deposited but which was not thermally treated, and a magnet test piece on which no Ti film was deposited and which was just machined.
Figure 6:
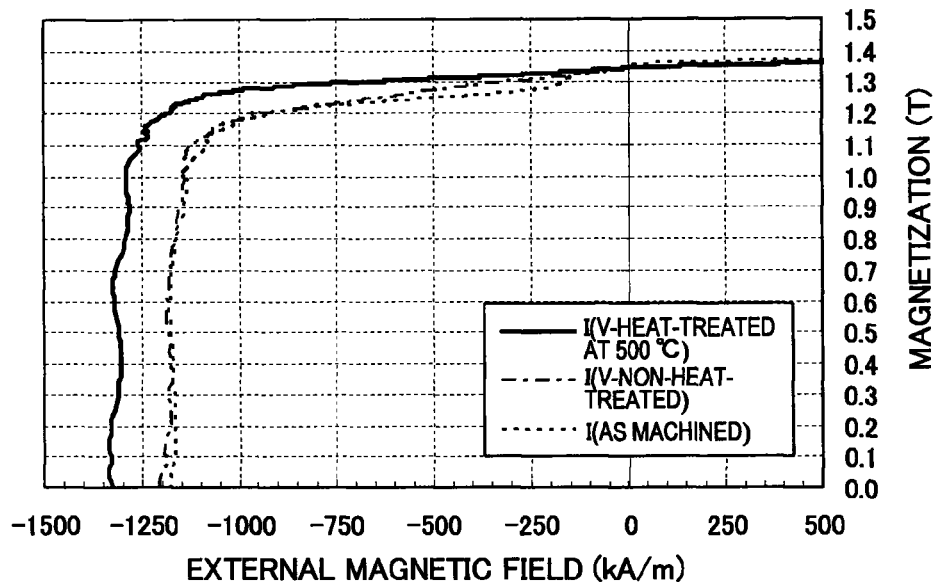
FIG. 6 is a graph showing the respective demagnetization curves of a magnet test piece on which a V film was deposited and which was thermally treated, a magnet test piece on which a V film was deposited but which was not thermally treated, and a magnet test piece on which no V film was deposited and which was just machined.
Figure 7:
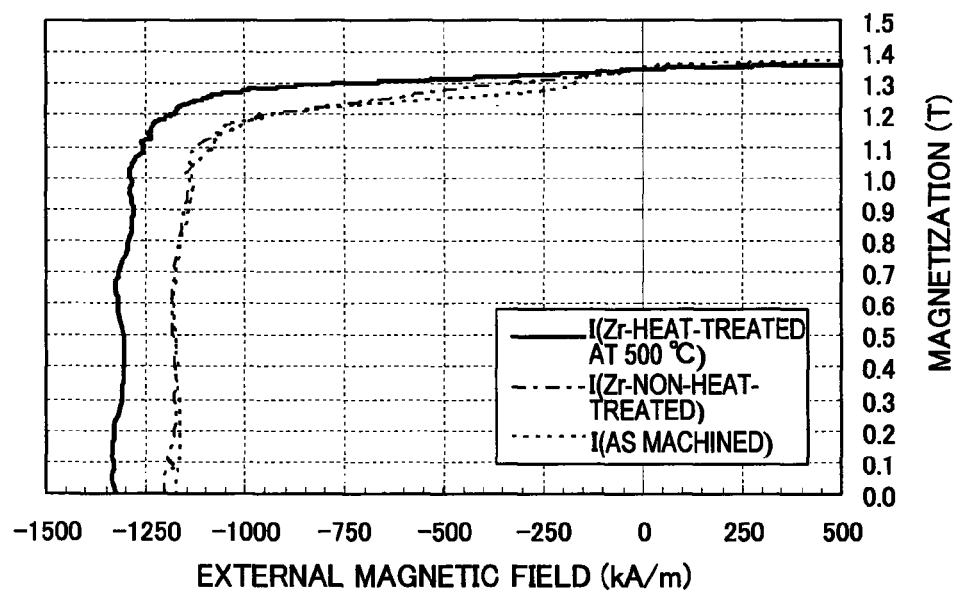
FIG. 7 is a graph showing the respective demagnetization curves of a magnet test piece on which a Zr film was deposited and which was thermally treated, a magnet test piece on which a Zr film was deposited but which was not thermally treated, and a magnet test piece on which no Zr film was deposited and which was just machined.
Figure 8:
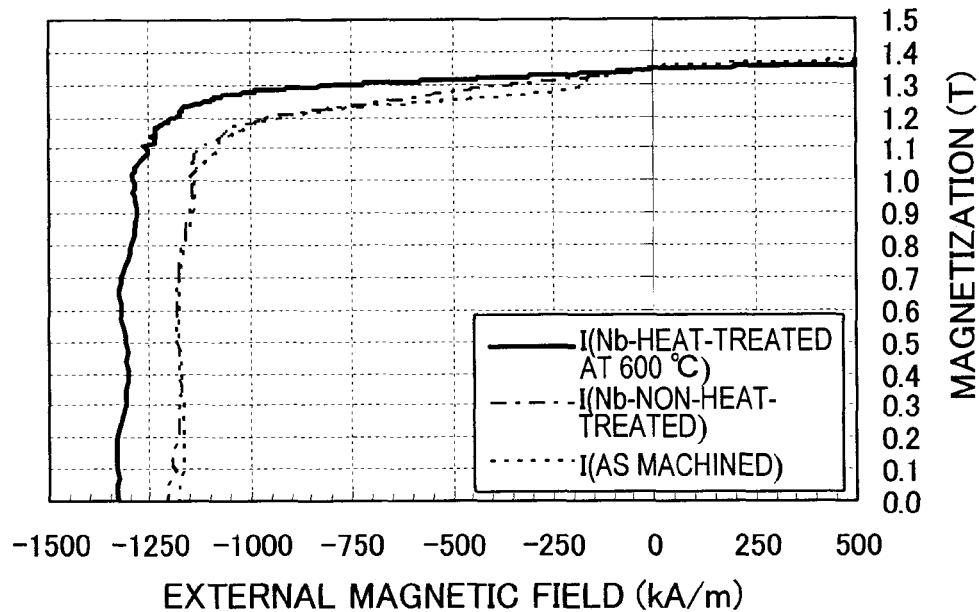
FIG. 8 is a graph showing the respective demagnetization curves of a magnet test piece on which a Nb film was deposited and which was thermally treated, a magnet test piece on which a Nb film was deposited but which was not thermally treated, and a magnet test piece on which no Nb film was deposited and which was just machined.
Figure 9:
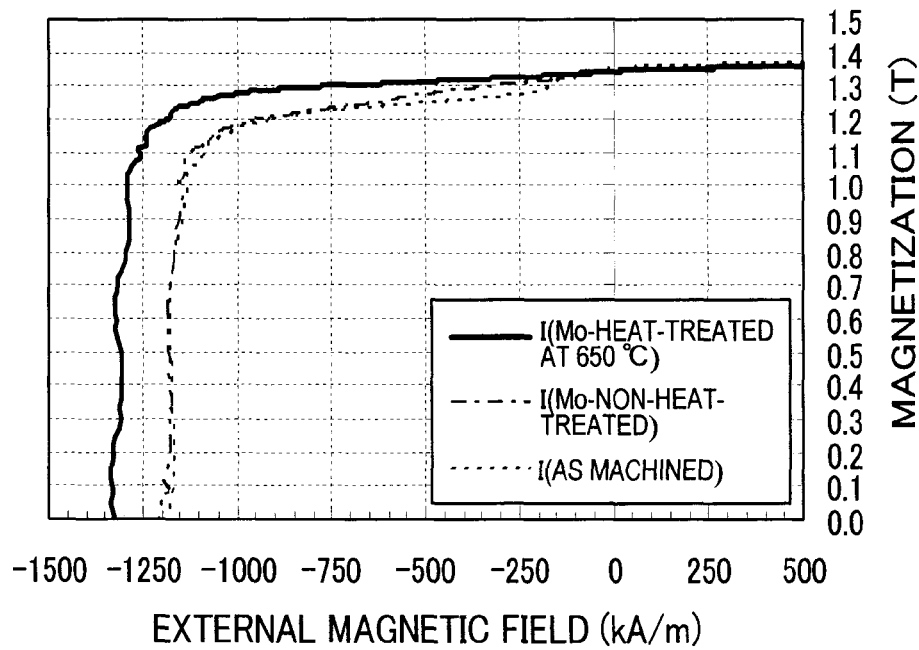
FIG. 9 is a graph showing the respective demagnetization curves of a magnet test piece on which a Mo film was deposited and which was thermally treated, a magnet test piece on which a Mo film was deposited but which was not thermally treated, and a magnet test piece on which no Mo film was deposited and which was just machined.
Figure 10:
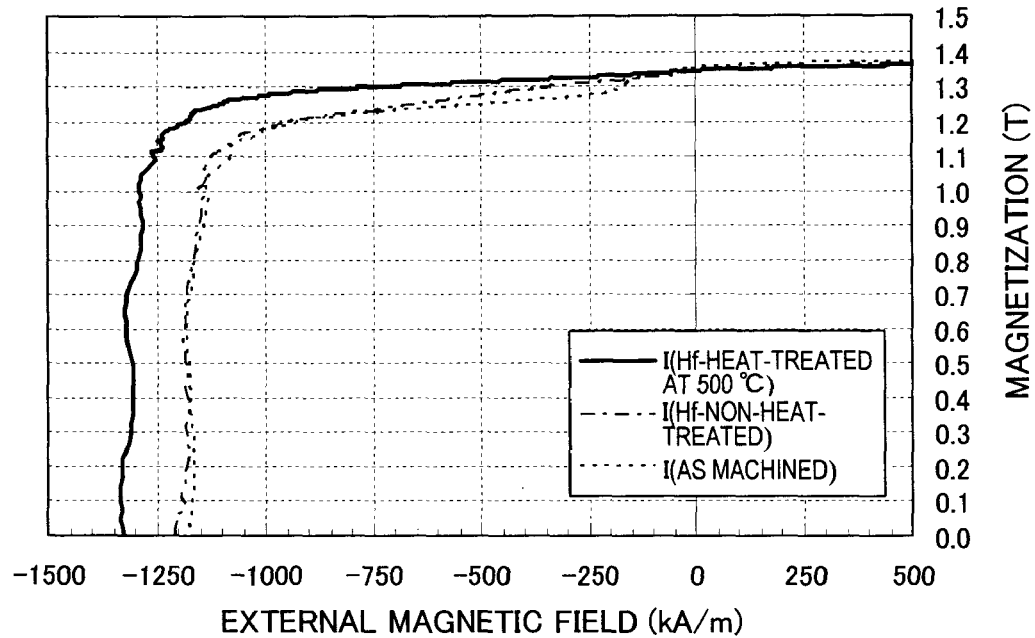
FIG. 10 is a graph showing the respective demagnetization curves of a magnet test piece on which a Hf film was deposited and which was thermally treated, a magnet test piece on which a Hf film was deposited but which was not thermally treated, and a magnet test piece on which no Hf film was deposited and which was just machined.
Figure 11:
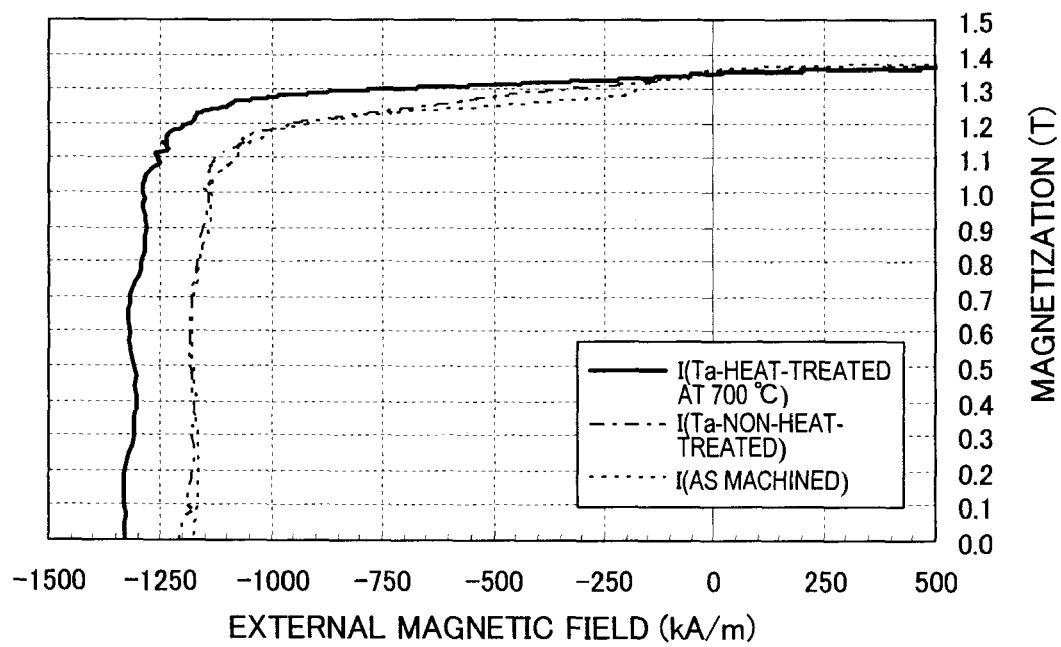
FIG. 11 is a graph showing the respective demagnetization curves of a magnet test piece on which a Ta film was deposited and which was thermally treated, a magnet test piece on which a Ta film was deposited but which was not thermally treated, and a magnet test piece on which no Ta film was deposited and which was just machined.
Figure 12:
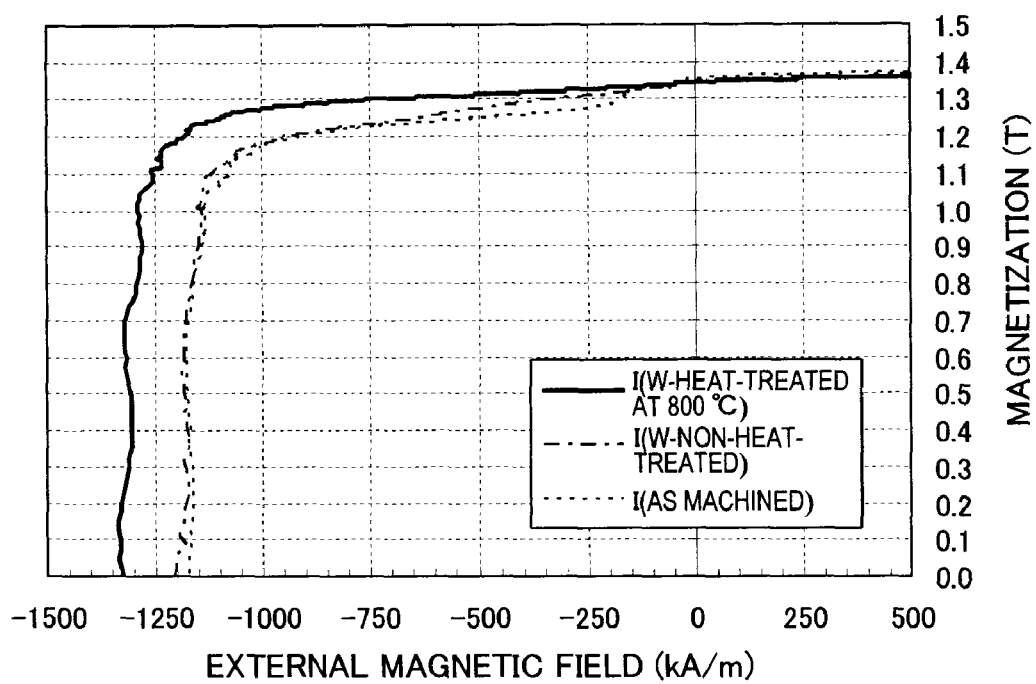
FIG. 12 is a graph showing the respective demagnetization curves of a magnet test piece on which a W film was deposited and which was thermally treated, a magnet test piece on which a W film was deposited but which was not thermally treated, and a magnet test piece on which no W film was deposited and which was just machined.

For a sample representing a specific example of the present invention in which reaction layers were formed by depositing a Ti film and then thermally treating it at 500° C. for an hour and for samples representing comparative examples in which no reaction layers were formed at all, the degrees of dependence of the magnetization on the external magnetic field were measured to obtain the demagnetization curve shown in FIG. 5. The samples in which no reaction layers were formed include a sample in which a Ti film was deposited but not thermally treated and a sample in which no Ti film was deposited. In FIG. 5, the bold curve shows the results of measurement on a sample that was thermally treated (as a specific example of the present invention), the one-dot chain curve shows the results of measurement on a sample that was not thermally treated at 500° C. for an hour (as a comparative example), and the dashed curve shows the results of measurement on a sample that had just been machined before reaction layers were formed there.

As can be seen from FIG. 5, the stepwise decrease after the machining process disappeared in this specific example and the loop squareness could be recovered and was better than the comparative examples.

EXAMPLES 3 TO 9

As in the second specific example described above, blocks of sintered magnets represented by the compositional formula $Nd_{30.1}$—$Dy_{1.2}$—$Fe_{67.7}$—$B_{1.0}$ (where subscripts indicate mass percentages) were made and then machined, thereby making thin-plate magnet test pieces with dimensions of 4 mm×6 mm×0.3 mm. The magnetization direction of these magnet test pieces was parallel to the side with a length of 4 mm.

The magnet test pieces were loaded into the chamber of a hollow cathode ion plating system to deposit metal films (shown in the following Table 1) to a thickness of 2 μm on the surface of the magnet test pieces as in the second specific example described above.

TABLE 1

| Sample | Ex. 3 | Ex. 4 | Ex. 5 | Ex. 6 | Ex. 7 | Ex. 8 | Ex. 9 |
|---|---|---|---|---|---|---|---|
| Metal film | V | Zr | Nb | Mo | Hf | Ta | W |
| Heat treatment temperature | 500° C. | 500° C. | 600° C. | 650° C. | 500° C. | 700° C. | 800° C. |

For samples representing Examples #3 through #9 of the present invention in which reaction layers were formed by depositing a metal film and then thermally treating it at 500° C. for an hour and for samples representing comparative examples in which no reaction layers were formed at all, the degrees of dependence of the magnetization on the external magnetic field were measured. The demagnetization curves obtained for the respective samples are shown in FIGS. 6 to 12. The samples in which no reaction layers were formed include a sample in which one of the metal films shown in Table 1 was deposited but not thermally treated and a sample in which no metal film was deposited. In FIGS. 6 to 12, the bold curve shows the results of measurement on a sample that was thermally treated at the temperature shown in Table 1 for one hour (as a specific example of the present invention), the one-dot chain curve shows the results of measurement on a sample that was not thermally treated (as a comparative example), and the dashed curve shows the results of measurement on a sample that had just been machined before reaction layers were formed there.

As shown in FIGS. 6 through 12, the properties obtained in Examples #3 through #9 in which various metal films shown in Table 1 were deposited were as good as what was obtained in Example #2. That is why a metal film according to the present invention does not have to be made of Ti but may also be made of at least one metal selected from the group consisting of Ti, V, Zr, Nb, Mo, Hf, Ta and W or an alloy thereof.

EXAMPLE 10

A magnet body represented by the compositional formula $Nd_{31.3}$—$Fe_{67.7}$—$B_{1.0}$ (where subscripts indicate mass percentages) was made so as to have dimensions of 7 mm×7 mm×7 mm. After the surface of this magnet body was cleaned with a mixed aqueous solution of a nitrate salt and nitric acid, a Ta film was deposited to a thickness of 3 μm on the surface of the magnet body by an arc ion plating process. Thereafter, the magnet body was thermally treated at 450° C. for one hour, thereby forming reaction layers.

The magnetic properties were measured. As a result, the remanence $B_r$ was 1.6 T and the coercivity $H_{cJ}$ was 1,500 kA/m. Thereafter, this magnet was subjected to a salt-spray test (compliant with the JIS Z 2371 standard) using a 5% NaCl solution (with a pH of 7.0) at 35° C. to see whether the magnet got corroded or not. As a result, even 300 hours after the test was started, the magnet never corroded and the magnetic properties thereof never deteriorated to such an extent as to cause some problems in practice.

Preferred embodiments of the present invention provide an ultra small rare-earth permanent magnet that can avoid degradation in magnetic properties, which is probably caused by the absence of the grain boundary phase on the surface, and that can keep good corrosion resistance even under a harsh environment.

It should be noted that the present invention is broadly applicable to any type of magnet, not just the sintered magnet, as long as the magnet tends to have deteriorated magnetic properties due to the absence of the grain boundary phase on the surface.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a rare-earth sintered magnet, the method comprising the steps of:
providing a magnet body made of an R—Fe—B based rare-earth sintered magnet material, where R is at least one rare-earth element;
depositing a metal film on the surface of the magnet body; and
a heat treatment process step that is performed to form, between the magnet body and the metal film, a plurality of reaction layers including:
a first reaction layer, which contacts with at least some of $R_2Fe_{14}B$ type crystals included in the magnet body, to have received the rare-earth element that has been included in the $R_2Fe_{14}B$ type crystals; and
a second reaction layer, which is located between the first reaction layer and the metal film and which has a lower rare-earth element concentration than that of the first reaction layer; wherein
the second reaction layer has received boron that has been included in the $R_2Fe_{14}B$ type crystals and has a higher boron concentration than that of the first reaction layer.

2. The method of claim 1, wherein the rare-earth element concentration of the first reaction layer accounts for at least about 30 mass % of the entire composition of the first reaction layer.

3. The method of claim 1, wherein the first reaction layer has a thickness of at least about 10 nm.

4. The method of claim 1, wherein the magnet body has a surface area to volume ratio of at least about 2 mm$^{-1}$ and a volume of at most about 100 mm$^3$.

5. The method of claim 1, wherein the surface of the magnet body includes a surface area that has been formed by a machining process and that is covered with the metal film.

6. The method of claim 1, wherein the metal film is made of at least one metal that is selected from the group consisting of Ti, V, Zr, Nb, Mo, Hf, Ta and W or an alloy thereof.

7. The method of claim 1, wherein the surface area of the magnet body has a surface roughness Ra of about 0.5 μm or less.

* * * * *